(12) United States Patent
Kosaka et al.

(10) Patent No.: US 8,471,377 B2
(45) Date of Patent: Jun. 25, 2013

(54) SEMICONDUCTOR DEVICE AND SEMICONDUCTOR CIRCUIT SUBSTRATE

(75) Inventors: Naoki Kosaka, Tokyo (JP); Hirotaka Amasuga, Tokyo (JP); Kou Kanaya, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 183 days.

(21) Appl. No.: 13/091,204

(22) Filed: Apr. 21, 2011

(65) Prior Publication Data
US 2012/0032296 A1 Feb. 9, 2012

(30) Foreign Application Priority Data
Aug. 9, 2010 (JP) .................................. 2010-178431

(51) Int. Cl.
*H01L 23/02* (2006.01)
*H01L 21/00* (2006.01)

(52) U.S. Cl.
USPC .... 257/686; 257/728; 257/785; 257/E23.085; 438/109

(58) Field of Classification Search
USPC ........... 257/686, 728, 785, E23.085; 438/109
See application file for complete search history.

(56) References Cited

U.S. PATENT DOCUMENTS
5,717,249 A * 2/1998 Yoshikawa et al. ........... 257/728
2008/0265430 A1 10/2008 Ishihara FOREIGN PATENT DOCUMENTS
| JP | 63-126260 A | 5/1988 |
| JP | 63-205918 A | 8/1988 |
| JP | 1-33341 A | 5/1989 |
| JP | 8-236695 A | 9/1996 |
| JP | 9-10963 A | 1/1997 |
| JP | 2005-136187 A | 5/2005 |

OTHER PUBLICATIONS

"Wafer-level packaging (WLP) and its applications"; *Maxim Integrated Products*, (May 1, 2008).

* cited by examiner

*Primary Examiner* — Minh-Loan T Tran
(74) *Attorney, Agent, or Firm* — Leydig, Voit & Mayer, Ltd.

(57) ABSTRACT

A semiconductor circuit substrate includes a transistor-forming substrate and a circuit-forming substrate. The transistor-forming substrate is a GaN substrate and has a Bipolar Junction Transistor (BJT) located in its top surface. The bottom surface of the transistor-forming substrate is flat and has contact regions. The circuit-forming substrate is a material other than a compound semiconductor and has no semiconductor active elements. The circuit-forming substrate has a flat top surface, contact regions buried in and exposed at the top surface, and passive circuits. The transistor-forming substrate and the circuit-forming substrate are directly bonded together without any intervening film, such as an insulating film.

16 Claims, 8 Drawing Sheets

SEMICONDUCTOR DEVICE AND SEMICONDUCTOR CIRCUIT SUBSTRATE

FIELD OF THE INVENTION

The present invention relates to a semiconductor device, a semiconductor circuit substrate, and a method of manufacturing a semiconductor circuit substrate.

BACKGROUND ART

Techniques have been known for bonding together a plurality of semiconductor substrates or semiconductor layers having semiconductor devices formed therein, as disclosed, e.g., in the following patent publications.

Japanese Laid-Open Patent Publication No. H01-133341 describes a technique of bonding an epitaxial Si layer or GaAs layer through an insulating film to an Si substrate, with these layers and the substrate having active elements formed therein. Japanese Laid-Open Patent Publication No. 2005-136187 describes a technique of bonding a GaAs layer to circuits on an Si substrate through projecting electrodes such as solder balls.

Japanese Laid-Open Patent Publication No. S63-205918 describes a technique of bonding an epitaxial AlGaAs layer through a low melting point metal layer to an Si substrate with an LSI formed therein. Further, Japanese Laid-Open Patent Publication No. H08-236695 describes a technique of bonding an AlGaAs layer through insulating layers to an Si substrate by Van der Waal's forces, wherein the AlGaAs layer has devices formed therein and the Si substrate has functional devices formed therein.

Compound semiconductor material can be used to manufacture semiconductor devices having superior characteristics, since it has better properties than other semiconductor material. However, the use of compound semiconductor material results in a considerably higher cost, since it is costly to form compound semiconductor layers and provide a semiconductor substrate of compound semiconductor material.

In semiconductor devices (e.g., high frequency semiconductor devices such as MMICs), semiconductor active elements, passive circuits, wiring conductors, and pads, etc. are formed on a semiconductor substrate to achieve the desired circuit configuration. It should be noted that passive circuits (including passive elements such as MIM capacitors and inductors) occupy more space than semiconductor active elements such as transistors and diodes. Therefore, if the design of a semiconductor device requires that all circuit elements (i.e., active elements and passive circuits) be formed side by side on the same compound semiconductor substrate, much of the available area on the compound semiconductor substrate (which is expensive) is occupied by the passive circuits. The result of this is that only a limited number of semiconductor devices can be manufactured from a single compound semiconductor substrate, making it difficult to reduce the chip manufacturing cost.

SUMMARY OF THE INVENTION

The present invention has been made to solve the above problems. It is, therefore, an object of the present invention to provide a semiconductor device which includes a high-performance compound semiconductor element yet is made from a reduced amount of compound semiconductor material, and also to provide a semiconductor circuit substrate from which such semiconductor devices are made, and also to provide a method of manufacturing the semiconductor circuit substrate.

According to a first aspect of the present invention, a semiconductor device includes: a first substrate; and a second substrate of material other than compound semiconductor.

The first substrate has a top surface and a flat bottom surface, and also has in the top surface a compound semiconductor layer in which a semiconductor active element is formed. The first substrate also has in the bottom surface a first contact region for electrical connection, and the first contact region is connected to the semiconductor active element.

The second substrate has a flat top surface, and also has a second contact region buried in and exposed at the top surface. The second substrate also has a passive circuit connected to the second contact region. The second substrate has no semiconductor active elements, and the passive circuit being either buried within the second substrate or exposed at a bottom side of the second substrate so that there are no irregularities on the top surface of the second substrate. The flat top surface of the second substrate is directly bonded to the flat bottom surface of the first substrate so that the first contact region is connected with the second contact region.

According to a second aspect of the present invention, a semiconductor circuit substrate includes: a first substrate; and a second substrate of material other than compound semiconductor.

The first substrate has a top surface and a flat bottom surface, and also has therein a compound semiconductor layer in which a plurality of semiconductor active elements are formed. The first substarate also has in the bottom surface a plurality of first contact regions for electrical connection, and each first contact region is connected to a respective one of the plurality of semiconductor active elements.

The second substrate has a flat top surface, and also has a plurality of second contact regions buried in and exposed at the top surface. The second substrate also has a plurality of passive circuits, each connected to a respective one of the plurality of second contact regions. The second substrate has no semiconductor active elements, and the plurality of passive circuits are either buried within the second substrate or exposed at a bottom side of the second substrate so that there are no irregularities on the top surface of the second substrate. The flat top surface of the second substrate is directly bonded to the flat bottom surface of the first substrate so that each of the plurality of first contact regions is connected with a respective one of the plurality of second contact regions.

According to a third aspect of the present invention, a method of manufacturing a semiconductor circuit substrate, includes the steps of:

providing a first substrate;
providing a second substrate;
forming a semiconductor active element in a compound semiconductor layer of the first substrate;
smoothing and activating the top surface of the second substrate; and
directly bonding a smoothed bottom surface of the first substrate to the smoothed top surface of the second substrate.

The first substrate includes a compound semiconductor layer and has a top surface and a bottom surface. The second substrate has a top surface and a bottom surface. The bottom surface of the first substrate is smoothed and activated by plasma treatment or by ions from an ion gun. A first contact region is formed in the bottom surface of the first substrate. The first contact region is adapted for electrical connection and is connected to the semiconductor active element.

The top surface of the second substrate is smoothed and activated by plasma treatment or by ions from an ion gun. A second contact region is formed so as to be buried in and exposed at the top surface of the second substrate. A passive circuit is formed in the second substrate, and the passive circuit is connected to the second contact region and is either buried within the second substrate or exposed at a bottom side of the second substrate so that there are no irregularities on the top surface of the second substrate.

The smoothed bottom surface of the first substrate is directly bonded to the smoothed top surface of the second substrate by thermocompression bonding or cold bonding so that the first contact region is connected with the second contact region.

Thus, in the semiconductor device of the first aspect of the present invention, a semiconductor active element is formed in the compound semiconductor layer of the first substrate to utilize properties of compound semiconductor material, whereas a passive circuit, which is of larger size than the semiconductor active element, is formed in the second substrate of material other than compound semiconductor. The first and second substrates are directly bonded together without any film or material therebetween, the presence of which may cause degradation of the characteristics of the semiconductor device. This construction makes it possible to provide a semiconductor device which includes a compound semiconductor active element yet is formed from a reduced amount of compound semiconductor material.

In the semiconductor circuit substrate of the second aspect, semiconductor active elements are formed in the compound semiconductor layer of the first substrate to utilize properties of compound semiconductor material, whereas passive circuits, which are of larger size than the semiconductor active elements, are formed in the second substrate of material other than compound semiconductor. The first and second substrates are directly bonded together without any film or material therebetween, the presence of which may cause degradation of the characteristics of the semiconductor circuit substrate. This construction makes it possible to provide a semiconductor circuit substrate which includes a plurality of high-performance compound semiconductor active elements yet is formed from a reduced amount of compound semiconductor material.

In the method of manufacturing a semiconductor circuit substrate in accordance with the third aspect of the present invention, semiconductor active elements are formed in the compound semiconductor layer of the first substrate to utilize properties of compound semiconductor material, whereas passive circuits, which are of larger size than the semiconductor active elements, are formed in the second substrate of material other than compound semiconductor. The first and second substrates are directly bonded together without any film or material therebetween, the presence of which may cause degradation of the characteristics of the semiconductor circuit substrate. This method allows the manufacture of semiconductor circuit substrates which include high-performance compound semiconductor active elements yet are formed from a reduced amount of compound semiconductor material.

DETAILED DESCRIPTION OF THE PREFERRED EMBODIMENTS

First Embodiment

Construction of First Embodiment (Structure of Semiconductor Circuit Substrate)

Figure 1:
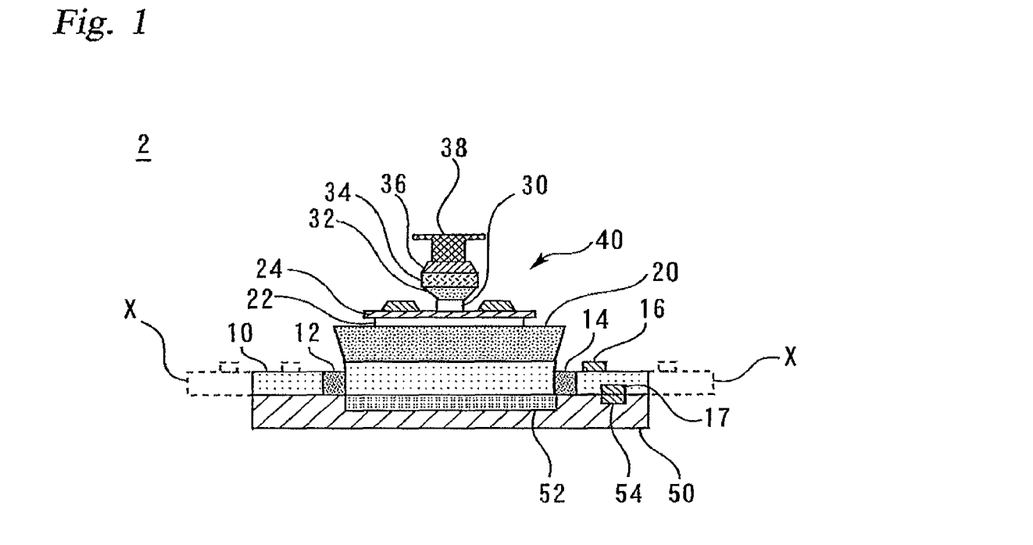
FIG. 1 is an enlarged cross-sectional view of a structure of a semiconductor circuit substrate in accordance with a first embodiment of the present invention.

FIG. 1 is an enlarged cross-sectional view of a device structure of a semiconductor circuit substrate 2 in accordance with a first embodiment of the present invention. This device structure of the present embodiment may be applied to MMICs (typically, high frequency circuits). The semiconductor circuit substrate 2 has formed therein a number of device structures identical to that shown in FIG. 1. These device structures are arranged across the surface of the semiconductor circuit substrate 2. Specifically, the semiconductor circuit substrate 2 has a structure including a transistor-forming substrate 10 and a circuit-forming substrate 50 bonded together on a wafer level.

It should be noted that the semiconductor circuit substrate 2 is eventually cut, or diced, into individual chips each corresponding to one of the device structures described above. Each discrete device structure (serving as a product) thus obtained corresponds to the "semiconductor device" of the first embodiment. It should be noted that semiconductor devices of the second and subsequent embodiments are also produced by dicing a semiconductor circuit substrate in the same manner as in the first embodiment.

The semiconductor circuit substrate 2 of the present embodiment has a structure in which the transistor-forming substrate 10 and the circuit-forming substrate 50 are bonded together. The transistor-forming substrate 10 and the circuit-forming substrate 50 are made of different materials. The transistor-forming substrate 10 includes a compound semiconductor epitaxial layer (in this embodiment, made of GaN). The circuit-forming substrate 50, on the other hand, is made of cheaper material than the transistor-forming substrate 10; it is in this embodiment made of Si.

Referring to FIG. 1, a semiconductor active element, namely, BJT (bipolar junction transistor) 40 is provided in the transistor-forming substrate 10. The transistor-forming substrate 10 has a thickness of 100 μm. The transistor-forming substrate 10 functions as the collector layer of the BJT 40. The BJT 40 has a multilayer structure including a collector 20, a base 22, an emitter 24, an emitter contact 30, a quasi-ohmic layer 32, a barrier layer 34, and emitter electrodes 36 and 38. The BJT 40 is also provided with inter-device isolation regions 12 and 14 and a wiring conductor 16. In the present embodiment, that surface of the transistor-forming substrate 10 in which the BJT 40 is provided is also referred to as the top surface of the substrate 10, and the surface (or bonding surface) of the transistor-forming substrate 10 which is bonded to the circuit-forming substrate 50 is also referred to as the bottom surface of the substrate 10, for convenience.

The circuit-forming substrate 50 has passive circuits (namely, MIM capacitors and inductors) therein. The circuit-forming substrate 50 also has contact regions 52 and 54 formed in its top surface. The contact regions 52 and 54 are made of conductive material (metal) and used to electrically connect the passive circuits in the circuit-forming substrate 50 to external circuits. The passive circuits in the circuit-forming substrate 50 can be electrically connected to the BJT 40 in the transistor-forming substrate 10 through the contact regions 52 and 54.

The transistor-forming substrate 10 has two contact regions. One of them is not shown and is located under the collector layer 20 of the transistor-forming substrate 10 (that is, this contact region is the portion of the BJT 40 in contact with the contact region 52). The other contact region is referred to herein as the contact region 17 and is an electrode provided in the bottom surface of the transistor-forming substrate 10 shown in FIG. 1. The contact region 17 is in contact with the contact region 54 of the circuit-forming substrate 50 and is electrically connected to the passive circuits in the circuit-forming substrate 50.

It should be noted that the semiconductor active element of the present embodiment shown in FIG. 1 is specifically an EDT (heterojunction bipolar transistor), and the electrode in contact with the lower part of the collector layer acts as its collector electrode. Thus, an electrode can be formed in direct contact with HBTS (thanks to their structure), but not with other types of transistors.

It should be noted that a via hole is formed through the transistor-forming substrate 10 to electrically connect components on the bottom side of the transistor-forming substrate 10 to those on the top side. The via hole is a through-hole formed in the transistor-forming substrate 10 and filled with wiring material such as Au. Specifically, the via hole is disposed in a predetermined perpendicular position to the plane of the paper in FIG. 1, and is connected with the contact region 54 of the circuit-forming substrate 50. This via hole extends from the top surface to the bottom surface of the transistor-forming substrate 10 (i.e., extends in a direction parallel to the plane of the paper in FIG. 1). Bonding the transistor-forming substrate 10 and the circuit-forming substrate 50 together results in electrical connection of the conductor in the via hole with the wiring conductor 16 and with the contact region 54. Thus the via hole serves to electrically connect the circuits in the transistor-forming substrate 10 to those in the circuit-forming substrate 50.

In FIG. 1, the dashed lines indicate regions X (made up of compound semiconductor epitaxial layer portions) which would be additionally required if all circuits of the semiconductor device were formed in the transistor-forming substrate 10. That is, the construction of the present embodiment eliminates the need for these regions X. Specifically, in accordance with the present embodiment, the transistor 40 and some of the circuits are formed in the transistor-forming substrate 10, and the remaining circuits are formed in the circuit-forming substrate 50, thereby eliminating the need for the regions X indicated by the dashed lines in FIG. 1. This means that the circuits in the circuit-forming substrates 50 correspond to the circuits which would be formed in the regions X if the circuit-forming substrate 50 were not provided. Thus, the construction of the present embodiment reduces the required circuit area on the transistor-forming substrate 10 (which is expensive), resulting in reduced cost of each chip.

Figure 2:
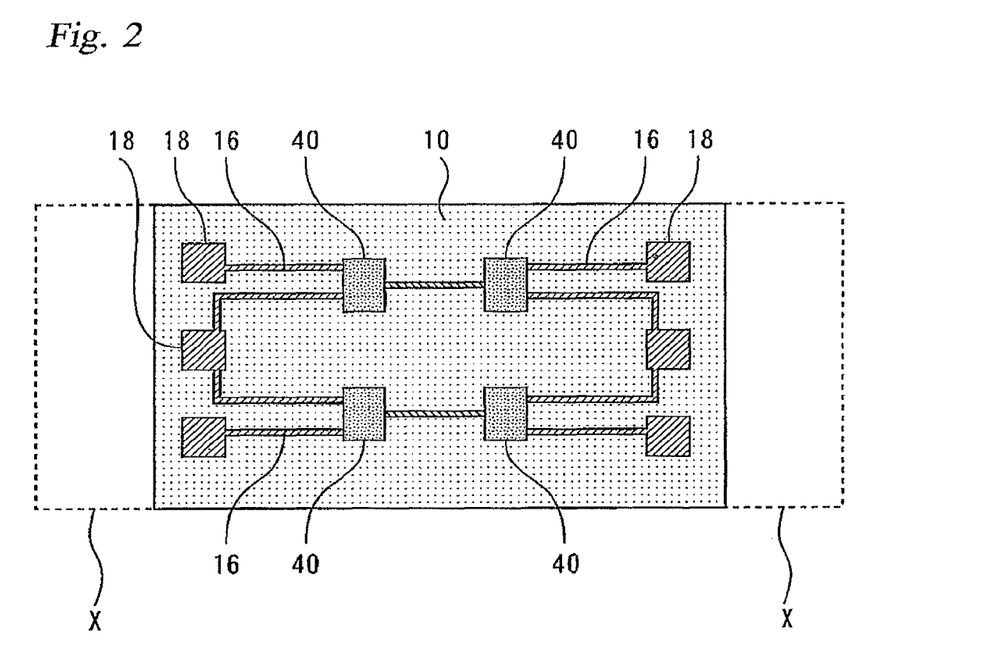
FIG. 2 is a plan view of a exemplary structure of the semiconductor circuit substrate of the first embodiment.

FIG. 2 is a plan view of another exemplary device structure of the semiconductor circuit substrate 2 of the first embodiment. Specifically, FIG. 2 shows a top view of an MMIC (monolithic microwave integrated circuit) having a structure in accordance with the present embodiment. There are shown four BJTs 40, six pads 18, and wiring conductors 16 connected therebetween. FIG. 2 corresponds to a top view of the semiconductor circuit substrate 2 shown in FIG. 1. The semiconductor circuit substrate 2 may include a plurality of MMICs identical to that shown in FIG. 2 which are arranged across the surface of the substrate 2 and formed on a wafer level.

(Bonding of Substrates Together)

The transistor-forming substrate 10 and the circuit-forming substrate 50 are directly bonded together. That is, in the present embodiment, no film (regardless of whether it is insulative or conductive) is present between the transistor-forming substrate 10 and the circuit-forming substrate 50.

The bonding of the transistor-forming substrate 10 and the circuit-forming substrate 50 may be accomplished by cold bonding or thermocompression bonding. The present embodiment uses a cold bonding technique.

In the cold bonding process atoms present on the bonding surface of each substrate are removed by plasma treatment or by ions from an ion gun to expose dangling bonds, which are available for bonding, and then these bonding surfaces are brought into pressure contact with each other.

The bonding surfaces of the transistor-forming substrate 10 and the circuit-forming substrate 50 are both flat. The circuits of each substrate must be buried under its bonding surface, or exposed at the surface opposite the bonding surface, in order to ensure that there are no irregularities on the bonding surface. The flat bonding surfaces of the transistor-forming substrate 10 and the circuit-forming substrate 50 preferably have a roughness of not more than 3 nm.

Since the bonding surfaces of the transistor-forming substrate 10 and the circuit-forming substrate 50 are flat, bonding of these surfaces results in electrical connection between the contact regions of the substrates. As a result, a circuit is formed by the connection of the semiconductor active device in the transistor-forming substrate 10 and the passive circuits in the circuit-forming substrate 50. Therefore, any material (insulator, etc.) which could affect the electrical characteristics of this circuit preferably should not be present between these substrates. Especially, if a high frequency circuit path includes an insulator or impurity at an intermediate location (in this example, between the bonded surfaces of the substrates), a reflection wave is generated at that location when high frequency power is transmitted through the path, resulting in power loss.

This problem can be avoided by using a cold bonding technique, which allows the two substrates (namely, the transistor-forming substrate 10 and the circuit-forming substrate 50) to be bonded together without any film or material therebetween. Thus, the cold bonding technique is advantageous when applied to the formation of the semiconductor circuit substrate of the present embodiment, since there is no need to interpose any film or material between the bonding surfaces of the substrates. A transistor produced using this technique may be used in a device such as an amplifier to improve the characteristics of the device.

The cold bonding technique, when applied to the bonding of substrates, has the following advantages over other types of bonding techniques. This technique does not require heat treatment in the bonding process, which treatment might adversely affect the transistor characteristics. Further, it also does not require that any insulator (film) be interposed between the bonding surfaces of the substrates, which surfaces have an electrical function. The absence of such insulator (film) avoids degradation of the characteristics of the devices which might otherwise occur, as well as avoiding a decrease in the manufacturing yield.

Thus, with the cold bonding technique, there is no need to perform heat treatment in the bonding process, which treatment might adversely affect the transistor characteristics. Further, any insulator (film) need not be interposed between the bonding surfaces of a first substrate (the transistor-forming substrate 10) and a second substrate (the circuit-forming substrate 50), which surfaces have an electrical function. The absence of such insulator (film) avoids degradation of the characteristics of the devices which might otherwise occur, as well as avoiding a decrease in the manufacturing yield. On the other hand, methods of bonding substrates by use of solder or bumps formed on the substrates are disadvantageous in that a space might be formed between the bonded surfaces of the substrates and prevent good electrical contact between these surfaces. For these reasons the cold bonding technique is suitable for producing the device structure of the present embodiment.

(Wafer Layer Transfer)

Figure 3:
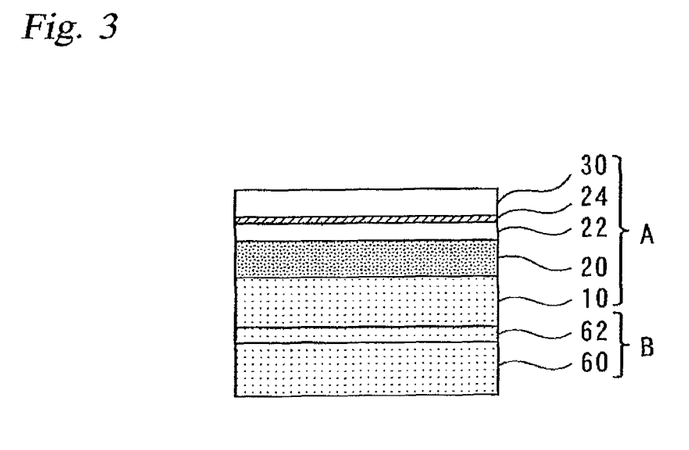
FIG. 3 shows a so-called wafer layer transfer technique, which is used in the first embodiment.

The so-called wafer layer transfer technique, which is used in the first embodiment, will be described with reference to FIG. 3. In the present embodiment, this wafer layer transfer technique is used to form the transistor-forming substrate 10 of the semiconductor circuit substrate 2. FIG. 3 shows an epitaxial layer structure from which the semiconductor circuit substrate 2 (except for the circuit-forming substrate 50) is formed. This structure eliminates the need to grind the bottom surface of the transistor-forming substrate 10, as described above. Referring to FIG. 3, a separation sacrificial layer 62 is provided between a seed substrate (substrate 60) and the transistor-forming substrate 10.

When the semiconductor circuit substrate is formed without using the wafer layer transfer technique, a layer of material must be ground away from the bottom surface of the transistor-forming substrate 10. This layer corresponds to the layer, or substrate, B shown in FIG. 3. In the case where the wafer layer transfer technique is used, the substrate B including the seed substrate 60 can be reused, thereby saving material, etc. The epitaxial layer structure shown in FIG. 3 is formed by first growing the separation sacrificial layer 62 on the seed substrate 60 and then growing on the separation sacrificial layer 62 a transistor active layer A which includes the transistor-forming substrate 10 (serving as a subcollector layer), the collector layer 20, the base layer 22, the emitter layer 24, and the emitter contact layer 30.

After forming the transistor from the epitaxial layer structure, the separation sacrificial layer 62 is wet etched to separate the seed substrate 60 from the transistor-forming substrate 10 having the transistor therein. The separated seed substrate 60 can be reused as an epitaxial growth substrate.

Manufacturing Method of First Embodiment

There will be described a method of manufacturing a semiconductor circuit substrate in accordance with the first embodiment.

First, a transistor-forming substrate including a compound semiconductor layer is provided. In the present embodiment, the transistor-forming substrate 10 of GaN is produced by the wafer layer transfer technique, as described above.

Further, a circuit-forming substrate formed of material other than compound semiconductor is provided. In the present embodiment, this substrate is the circuit-forming substrate 50, which is made of a single semiconductor material, namely, Si.

Semiconductor active devices (namely, the BJTs 40) are formed in the transistor-forming substrate 10. Further, the bottom surface of the transistor-forming substrate 10 is activated and smoothed by plasma treatment or by ions from an ion gun in preparation for cold bonding as described above. Further, contact regions connected to the BJTs 40 and used for electrical connection are formed in the bottom surface of the transistor-forming substrate 10.

The top surface of the circuit-forming substrate 50 is also activated and smoothed by plasma treatment or by ions from an ion gun so that the circuit-forming substrate 50 can be directly bonded to the transistor-forming substrate 10. Further, the contact regions 52 and 54 are formed in and exposed at the top surface of the circuit-forming substrate 50. Further, passive circuits (not shown) and wiring conductors are formed in the circuit-forming substrate 50 so that they are buried under the smoothed top surface of the substrate 50 and do not cause irregularities on the top surface. Alternatively, in order not to cause irregularities on the top surface, these passive circuits may be formed in the circuit-forming substrate 50 so that they are exposed at or protrude from the bottom surface of the circuit-forming substrate 50, which surface is not bonded to the transistor-forming substrate 10. The passive circuits are connected to the contact regions 52 and 54.

The smoothed bottom surface of the transistor-forming substrate 10 is directly bonded to the smoothed top surface of the circuit-forming substrate 50 by cold bonding so that the contact regions of the transistor-forming substrate 10 (i.e., the contact regions 17 and the contact regions, not shown, under the BJTs 40) are connected with the contact regions 54 and 52, respectively, of the circuit-forming substrate 50. Thus, the transistor-forming substrate 10 and the circuit-forming substrate 50 are bonded together on a wafer level.

It should be noted that these substrates may be directly bonded together by thermocompression bonding instead of cold bonding.

Advantages of First Embodiment

Advantages of the present embodiment will be described in comparison with the comparative examples shown in FIGS. 17 and 18.

In conventional MMICs (typically, high frequency circuits), passive circuits (which include passive elements such as MIM capacitors and inductors) occupy a significantly larger area on the substrate than transistors. That is, the number of transistors that can be formed on a substrate is limited by the area of the passive circuits on the substrate. This makes it difficult to reduce the manufacturing cost of chips produced from substrates of expensive material such as compound semiconductor.

Figure 17:
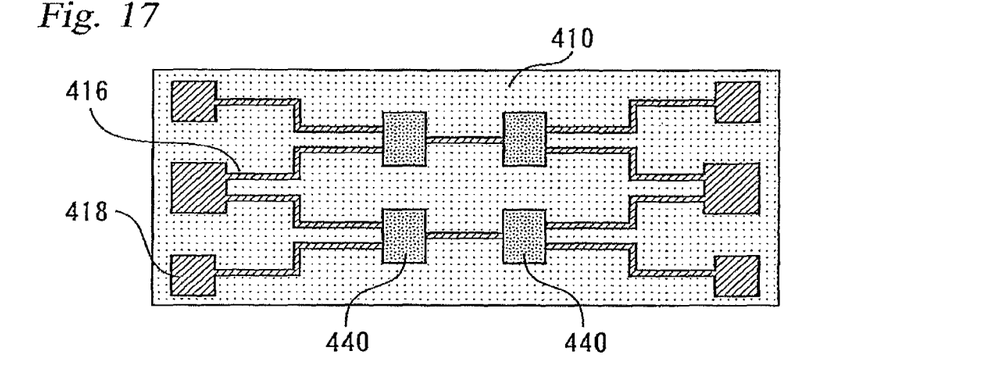
FIG. 17 is a diagram showing a comparative MMIC, and will be used to describe the advantages of the semiconductor circuit substrate of the first embodiment.

FIG. 17 is a diagram showing a comparative MMIC, and will be used to describe the advantages of the semiconductor circuit substrate of the first embodiment. Specifically, FIG. 17 is a top view of an MMIC designed according to a conventional technique. Referring to this figure, transistors 440, wiring conductors 416, and pads 418 are formed on a substrate 410. Each transistor 440 has a multilayer structure including a collector 420, a base 422, an emitter 424, an emitter contact 430, a quasi-ohmic layer 432, a barrier layer 434, and emitter electrodes 436 and 438. Comparison of FIG. 2 with FIG. 17 reveals that the MMIC of FIG. 2 is smaller in area than that of FIG. 17 by an amount corresponding to the left and right regions X indicated by the dashed lines in FIG. 2. This results from the fact that the MMIC shown in FIG. 2 includes the circuit-forming substrate 50 bonded to the back surface of the transistor-forming substrate 10 (as viewed in FIG. 2) and portions of the wiring conductors of the MMIC (which portions occupy a considerable substrate surface area) are formed in this circuit-forming substrate 50.

Figure 18:
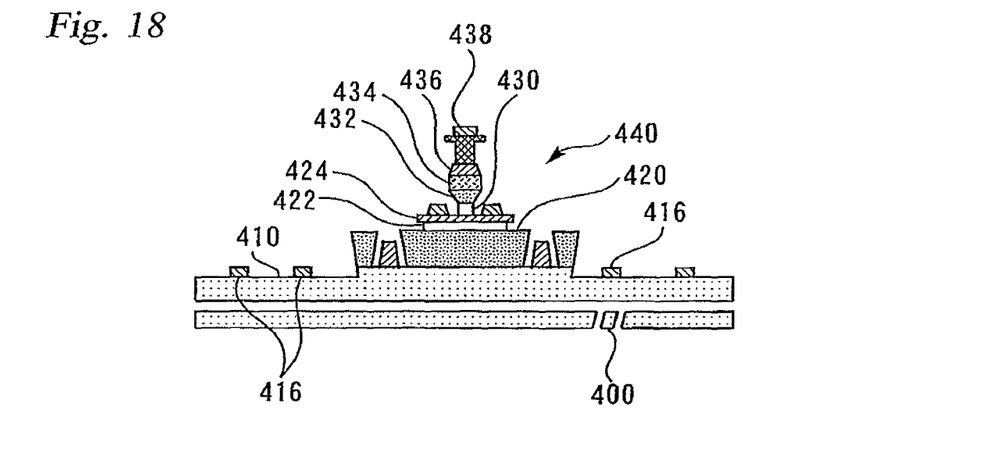
FIG. 18 is a diagram showing a comparative MMIC, and will be used to describe the advantages of the semiconductor circuit substrate of the first embodiment.

FIG. 18 is a diagram showing a comparative transistor structure, and will be used to describe the advantages of the semiconductor circuit substrate of the first embodiment. Specifically, FIG. 18 shows a transistor structure formed by a conventional technique. In this conventional structure, wiring conductors 416, together with the semiconductor active element (i.e., BJT 440 in FIG. 18), take up a considerably large area on the compound semiconductor substrate 410. Thus, in this structure, the wiring conductors 416 and passive circuits (not shown) are all disposed on the compound semiconductor substrate 410.

On the other hand, in accordance with the present embodiment, a semiconductor active element is formed in the compound semiconductor epitaxial layers of the transistor-forming substrate 10, and passive circuits are formed in the circuit-forming substrate 50 made of material other than compound semiconductor. With this arrangement, the smoothed bottom surface of the transistor-forming substrate 10 is bonded to the smoothed top surface of the circuit-forming substrate 50, so that a circuit is formed by the connection of the semiconductor active element with the passive circuits. The semiconductor active element has good characteristics, since it is made of compound semiconductor, which has better properties than other semiconductor material. Further, as described above, the passive circuits, which require a relatively large circuit area, are formed in the circuit-forming substrate 50, which is not made of expensive compound semiconductor material.

Thus, in the present embodiment, the transistor-forming substrate 10 including compound semiconductor has an active element formed therein, and the circuit-forming substrate 50 of material other than compound semiconductor has passive circuits formed therein. That is, these substrates are assigned different functions. As a result, the required surface area of the compound semiconductor layer (or the transistor-forming substrate 10) is smaller than when both the active element and the passive circuits are formed side by side on a substrate, making it possible to save an amount of compound semiconductor material corresponding to the passive circuits formed in the circuit-forming substrate 50.

Further in the present embodiment, the transistor-forming substrate 10 is directly bonded to the circuit-forming substrate 50 without any film or material therebetween, the presence of which may cause degradation of the characteristics of the circuit formed by the BJT 40 in the transistor-forming substrate 10 and the passive circuits (not shown) in the circuit-forming substrate 50. In other words, although in the present embodiment the passive circuits are formed in the circuit-forming substrate 50 instead of the transistor-forming substrate 10, this does not adversely affect the characteristics of the circuit formed by the BJT 40 and the passive circuits, since the substrates 10 and 50 are directly bonded together. (If there were a film or material between these substrates, a wave could be reflected by it when power is transmitted through the circuit, which may be a high frequency circuit, resulting in degradation of the characteristics of the circuit and the semiconductor device.) Thus, the present embodiment allows a semiconductor device to be formed from a reduced amount of compound semiconductor material without degradation of its characteristics.

Further, since the active element is formed from the compound semiconductor layers of the transistor-forming substrate 10, the element has better performance than active elements made of material other than compound semiconductor. On the other hand, the passive circuits are formed in the circuit-forming substrate 50, which is made of material other than compound semiconductor material. This reduces the total amount of compound semiconductor material (which is generally expensive) required to produce the semiconductor device, resulting in reduced cost.

Incidentally, a technique is known for grinding the back surface of a wafer to reduce its thickness after forming transistors on the wafer, in order to enhance the heat dissipation characteristics of the transistors and reduce the chip size. This means that the material ground away from the back surface of the wafer is wasted.

Specifically, referring to FIG. 18, the back surface of the substrate 410 is ground to reduce its thickness after the transistor (i.e., BJT 440) is formed. (For example, a substrate with an MMIC may be reduced in thickness from 625 μm to 100 μm.) In FIG. 18, the reference numeral 400 denotes the portion of the substrate 410 which is ground away and wasted. When the substrate is made of expensive material such as compound semiconductor, a reduction in the size of this wasted portion 400 results in a reduction in the chip cost. Therefore, it desirable to reduce or eliminate this portion 400.

In the first embodiment, on the other hand, since the transistor-forming substrate 10 is formed using the wafer layer transfer technique, the portion of the substrate 10 corresponding to the wasted portion 400 shown in FIG. 18 can be reused and therefore is not wasted.

It should be noted that in the first embodiment the semiconductor circuit substrate 2 is eventually cut into individual chips, each corresponding to, e.g., the device structure shown in FIG. 1. Therefore, each chip or device structure corresponds to the semiconductor device of the first aspect of the present invention described in the Summary of the Invention section. Further, the following should be noted: the transistor-forming substrate 10 of the first embodiment corresponds to the first substrate of the first aspect of the invention; the BJT 40 corresponds to the semiconductor active element of the first aspect; and the exposed portion of the via hole (not shown) in the bottom surface of the transistor-forming substrate 10 corresponds to the first contact region of the first aspect. Further, the circuit-forming substrate 50 of the first embodiment described above corresponds to the second substrate of the first aspect of the invention; each of the passive circuits (not shown) formed in the circuit-forming substrate 50 and including wiring conductors corresponds to the passive circuit of the first aspect; and the contact regions 52 and 54 each correspond to the second contact region of the first aspect.

The following should also be noted: the semiconductor circuit substrate 2 of the first embodiment described above corresponds to the semiconductor circuit substrate of the second aspect of the present invention described in the Summary of the Invention section; the transistor-forming substrate 10 also corresponds to the first substrate of the second aspect; the BJT 40 also corresponds to each semiconductor active element of the second aspect; and the contact regions in the bottom surface of the transistor-forming substrate 10 (i.e., the contract region, not shown, under the BJT 40 and the exposed portion of the via hole, not shown) correspond to the first contact regions of the second aspect. Further, the circuit-forming substrate 50 of the first embodiment described above also corresponds to the second substrate of the second aspect of the invention; the passive circuits (not shown) formed in the circuit-forming substrate 50 and including wiring conductors also correspond to the passive circuits of the second aspect; and the contact regions 52 and 54 also correspond to the second contact regions of the second aspect.

It should be further noted that the semiconductor device (MMIC) shown in FIG. 2 and including 4 semiconductor active elements (BJTs 40) also corresponds to the semiconductor device of the first aspect of the invention. In this case, each of the 4 BJTs 40 corresponds to the semiconductor active element of the first aspect.

Variations of First Embodiment

In the first embodiment, a vertical structure device (namely, the BJT 40) is provided in the transistor-forming substrate 10, as shown in FIG. 1. However, the present invention is not limited to this particular type of semiconductor active element. Any other suitable semiconductor active element (such as, e.g., an FET, an HBT, or a diode) may be provided in a compound semiconductor epitaxial layer (corresponding to the transistor-forming substrate 10).

Further, although the first embodiment has been described in connection with the MMIC shown in FIG. 2, it is to be understood that the present invention is not limited to MMICs and high frequency circuits, but may be applied to various semiconductor devices and circuits.

It should be noted that the outer 100 μm of the surface of the transistor-forming substrate 10 may be used as a bonding area, and the active element may be disposed in an area defined and surrounded by this bonding area. Likewise, the passive elements may be disposed in an area defined and surrounded by the bonding area of the circuit-forming substrate 50.

In the practice of the present embodiment, various types of transistor material (specifically, compound semiconductor material) can be used such as GaN, SIC, GaAs, and InP. Further, various types of wide-gap semiconductor material may be used instead of Si (silicon).

InP is advantageous over GaAs in that the electron speed in InP is high and hence InP provides superior high frequency characteristics. That is, for example, InP transistors have a higher gain than GaAs transistors at high frequencies. Further, GaN provides high dielectric strength, and therefore GaN transistors can be driven by a high voltage and operated at high output.

Further, SiC (a wide-gap semiconductor material) can be used in high current, high frequency, and high temperature applications and provides high insulation and a low threshold voltage. Switching devices and diode devices formed of such a wide-gap semiconductor material can be of a reduced size since they have high dielectric strength and high current density capacity. Further, the reduced size of these devices allows for a reduction in the size of the semiconductor modules containing them. Further, switching devices and diode devices of wide-gap semiconductor material have reduced power loss and hence have increased efficiency, making it possible to increase the efficiency of the semiconductor modules containing them.

Further, the circuit-forming substrate 50 may be made of material other than Si. It should be noted that suitable materials for making the transistor-forming substrate 10 include compound semiconductor materials such as GaAs, GaN, and InP which greatly contribute to the characteristics of the transistors (or active elements) formed in the transistor-forming substrate 10. The circuit-forming substrate 50, on the other hand, is preferably made of Si, which is low cost and can be used in combination with the compound semiconductor materials described above.

It should be appreciated that cold bonding is not the only technique that may be used to bond the transistor-forming substrate 10 and the circuit substrate 50 together. Any other suitable bonding technique, e.g., thermocompression bonding may be used to directly bond these substrates without any film (such as an insulating film) therebetween.

Second Embodiment

In order to avoid undue repetition, components identical or corresponding to those of the first embodiment are hereinafter denoted by the same reference numerals, and description of these components may be omitted or simplified when appropriate.

Figure 4:
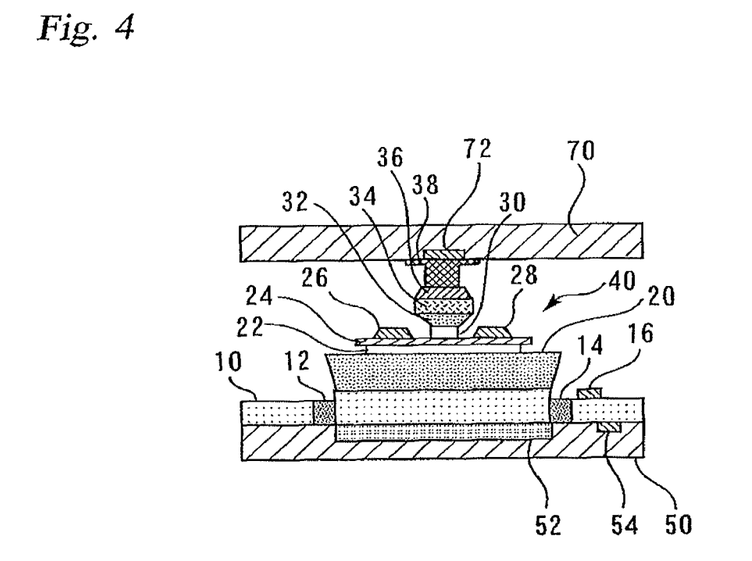
FIG. 4 is a diagram showing a structure of a semiconductor circuit substrate in accordance with a second embodiment of the present invention.

FIG. 4 is a diagram showing a device structure of a semiconductor circuit substrate in accordance with a second embodiment of the present invention. The semiconductor circuit substrate of the second embodiment includes the transistor-forming substrate 10 and circuit-forming substrates 50 and 70 bonded together on a wafer level so as to form a number of device structures identical to that shown in FIG. 4 which are arranged across the surface of the transistor-forming substrate 10, as is the case with the semiconductor circuit substrate 2 of the first embodiment. This semiconductor circuit substrate is eventually cut, or diced, into individual chips each corresponding to the device structure shown in FIG. 4. Each discrete device structure, or chip, corresponds to the "semiconductor device" of the second embodiment.

In the second embodiment, the circuit-forming substrate 70 (which is similar to the circuit-forming substrate 50 bonded to the bottom surface of the transistor-forming substrate 10 as shown in FIG. 1) is bonded to the top side of the transistor-forming substrate 10. The circuit-forming substrate 70 includes a contact region 72 of conductive material. The circuit in the circuit-forming substrate 70 is electrically connected to the BJT 40 in the transistor-forming substrate 10 through the contact region 72.

Like the circuit-forming substrate 50, the circuit-forming substrate 70 is made of material other than compound semiconductor material (in the second embodiment, made of Si). Like the circuit-forming substrate 50, the circuit-forming substrate 70 has formed therein only passive circuits including wiring conductors and has no semiconductor active elements.

Thus the semiconductor circuit substrate of the present embodiment differs from that of the first embodiment in that it includes the circuit-forming substrate 70 which includes additional passive circuits. Thus the construction of the semiconductor circuit substrate of the present embodiment can accommodate more passive circuits.

Third Embodiment

In order to avoid undue repetition, components identical or corresponding to those of the first embodiment are hereinafter denoted by the same reference numerals, and description of these components may be omitted or simplified when appropriate.

Figure 5:
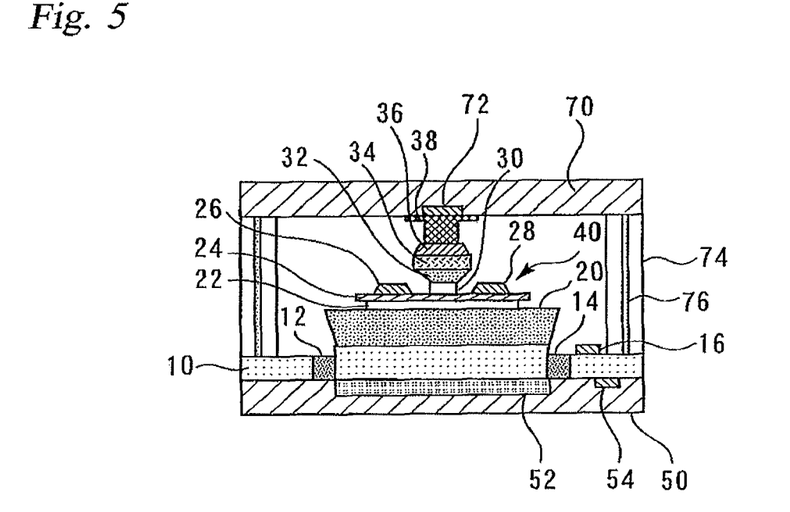
FIG. 5 is a diagram showing a device structure of a semiconductor circuit substrate in accordance with a third embodiment of the present invention.

FIG. 5 is a diagram showing a device structure of a semiconductor circuit substrate in accordance with a third embodiment of the present invention. The semiconductor circuit substrate of the third embodiment includes the transistor-forming substrate 10 and the circuit-forming substrates 50 and 70 bonded together on a wafer level so as to form a number of device structures identical to that shown in FIG. 5 which are arranged across the surface of the transistor-forming substrate 10, as is the case with the semiconductor circuit substrates of the first and second embodiment. This semiconductor circuit substrate is eventually cut, or diced, into individual chips each corresponding to the device structure shown in FIG. 5. Each discrete device structure, or chip, corresponds to the "semiconductor device" of the third embodiment.

The device structure of the present embodiment differs from that shown in FIG. 4 in that it includes a sidewall 74 which extends along the sides of the BJT 40. The space enclosed by the transistor-forming substrate 10, the circuit-forming substrate 70, and the sidewall 74 may be filled with resin or left vacant, thus packaging the BJT 40 (which is a semiconductor active element). The sidewall 74 has via holes 76 therein which are formed by providing the inside of through-holes with conductive material (e.g., Au plating). These via holes 76 can be used for electrical connection. It should be noted that the term "via hole" as used herein encompasses a plug (i.e., conductive material filling a through-hole).

Figure 6:
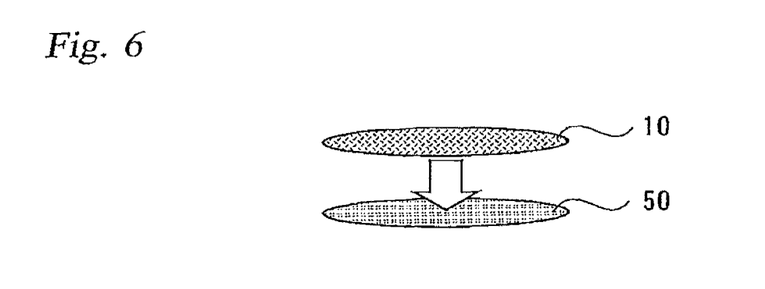
FIG. 6 shows a manufacturing process (wafer bonding) in accordance with a third embodiment of the present invention.

It should be noted that the top and bottom surfaces of the transistor and the sidewall 74 are formed on a wafer level, as shown in FIG. 6, thus simplifying the process. This allows the plurality of BJTs 40 provided on the transistor-forming substrate 10 to be packaged at once. The wafer can be of any size. Further, the wafer may be cut into several smaller pieces, since the larger the wafer size, the more likely the wafer (or substrate) will be warped when it is thin. When wafers of full size are bonded together, the two orientation flats of each wafer may be used for alignment. Alternatively, the substrates to be bonded (i.e., the transistor-forming substrate 10 and the circuit-forming substrate 50) may have holes accurately formed by use of a mask and may be aligned with each other using these holes instead of the orientation flats.

Although in the third embodiment the sidewall 74 has the via holes 76, it is to be understood that in other embodiments the sidewall 74 may not have such via holes.

Fourth Embodiment

FIGS. 7 to 10 are diagrams illustrating a method of manufacturing a semiconductor circuit substrate in accordance with a fourth embodiment of the present invention. Specifically, this manufacturing method is used to make a semiconductor circuit substrate similar to that of the third embodiment and includes forming the sidewall 74.

Figure 7:
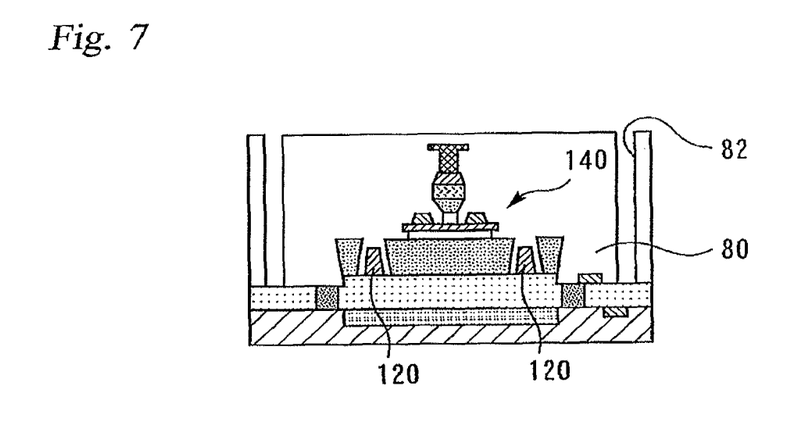
FIG. 7 is a diagram illustrating a method of manufacturing a semiconductor circuit substrate in accordance with a fourth embodiment of the present invention.

However, the semiconductor active element (or transistor 140) of the fourth embodiment differs from those of the first to third embodiments (shown in FIGS. 1 to 4). Specifically, the transistor 140 of the fourth embodiment includes collector electrodes 120, as shown in FIG. 7. However, the manufacturing method of the fourth embodiment may be used to make the BJT 40 described in connection with the first to third embodiments.

FIG. 7 is a diagram showing a partially completed semiconductor circuit substrate after an intermediate step in the method. As shown in FIG. 7, the transistor 140 (similar in construction to the BJT 40 shown in FIG. 1) is formed in the transistor-forming substrate 10 and is covered, together with the substrate surface, by a protective material 80 (a resist, etc.) having a groove 82 which is to be filled with a sidewall material. The protective material 80 has a height great enough to cover the emitter electrode 38 at the top of the transistor 140. When the protective material 80 is a resist, the groove 82 may formed by exposure, development, and etching of the material. Alternatively, it may be formed by use of a sharp pointed tool such as a needle, or a machining device such as a laser machining device.

Figure 8:
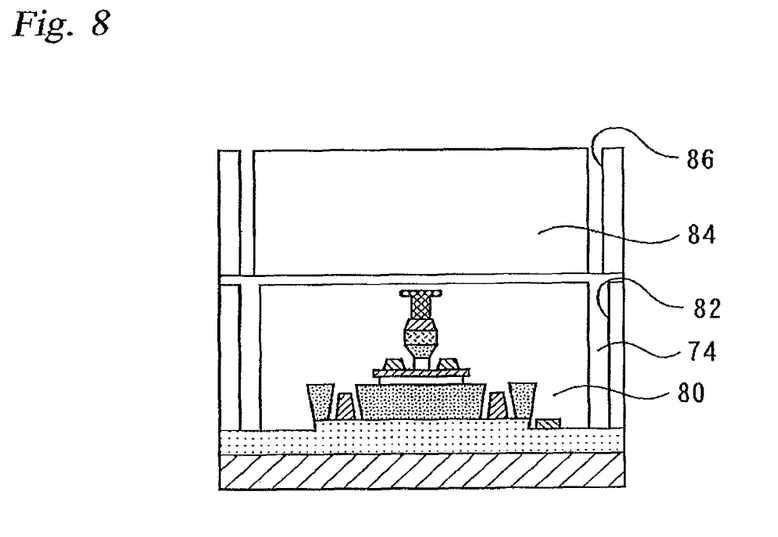
FIG. 8 is a diagram illustrating a method of manufacturing a semiconductor circuit substrate in accordance with a fourth embodiment of the present invention.

FIG. 8 is a diagram showing the structure of FIG. 7 after a protective material 84 has been deposited thereon and after a groove 86 is formed in the protective material 84. Specifically, the sidewall-forming groove 82 of the structure of FIG. 7 is filled with a packaging material 74 (or resin or conductive material). The protective material 84 (e.g., resist) is then deposited on the structure, and the groove 86, which is thinner than the groove 82, is formed in the deposited protective material 84 immediately above the groove 82. Like the groove 82, the groove 86 is formed by etching or using one of various machining devices.

Figure 9:
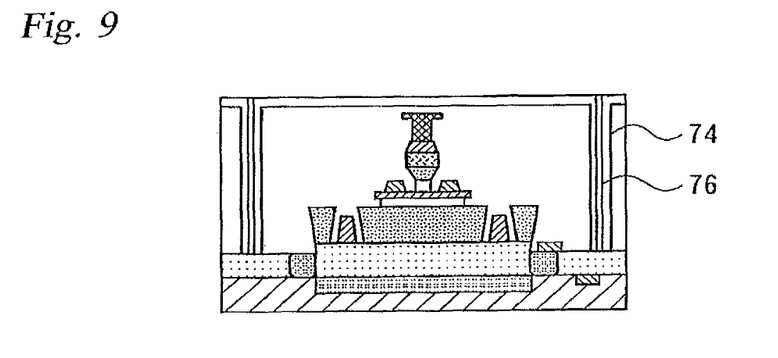
FIG. 9 is a diagram illustrating a method of manufacturing a semiconductor circuit substrate in accordance with a fourth embodiment of the present invention.

FIG. 9 is a diagram showing the structure of FIG. 8 after via holes 76 have been formed in the packaging material 74. Specifically, the via holes 76 (through-holes) are formed in the packaging material 74 of the structure of in FIG. 8 by, e.g., dry etching.

Figure 10:
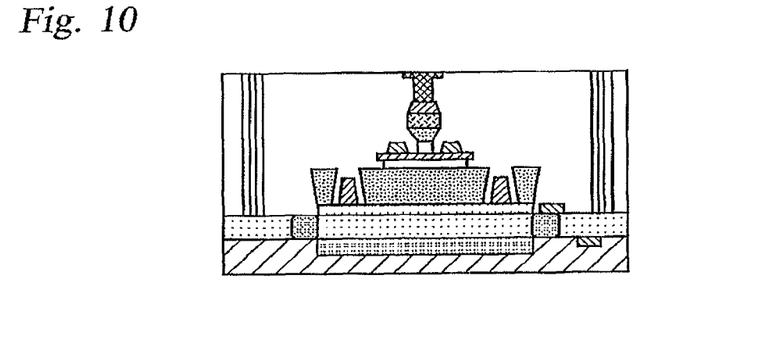
FIG. 10 is a diagram illustrating a method of manufacturing a semiconductor circuit substrate in accordance with a fourth embodiment of the present invention.

FIG. 10 is a diagram showing the structure of FIG. 9 after material has been removed from the surface of the transistor (including the surface of the emitter electrode 38) so as to expose the emitter electrode 38. This removal of material from the transistor surface may be accomplished by a known technique such as CMP (chemical mechanical polishing) or dry etching. It should be noted that the protective material 80 (a resist, etc.) covering the sides of the transistor 140 is either removed or not removed. The removal of the protective material 80 leaves a vacant space around the transistor 140. On the other hand, if the protective material 80 is not removed, the transistor 140 remains covered and protected by the material.

The semiconductor circuit substrate of the fourth embodiment includes the transistor-forming substrate 10 and the circuit-forming substrates 50 and 70 bonded together on a wafer level so as to form a number of device structures identical to that shown in FIG. 4 which are arranged across the surface of the transistor-forming substrate 10, as is the case with the semiconductor circuit substrate of the first embodiment. That is, although FIGS. 7 to 10 show only one transistor 140, the semiconductor circuit substrate includes a number of transistors 140 arranged across the wafer surface. The method of manufacturing a semiconductor circuit substrate in accordance with the fourth embodiment produces each of these transistors 140 on a wafer level in the manner as shown in FIGS. 7 to 10. This semiconductor circuit substrate (or wafer) is eventually cut into individual chips, each corresponding to the device structure shown in FIG. 4.

Fifth Embodiment

Figure 11:
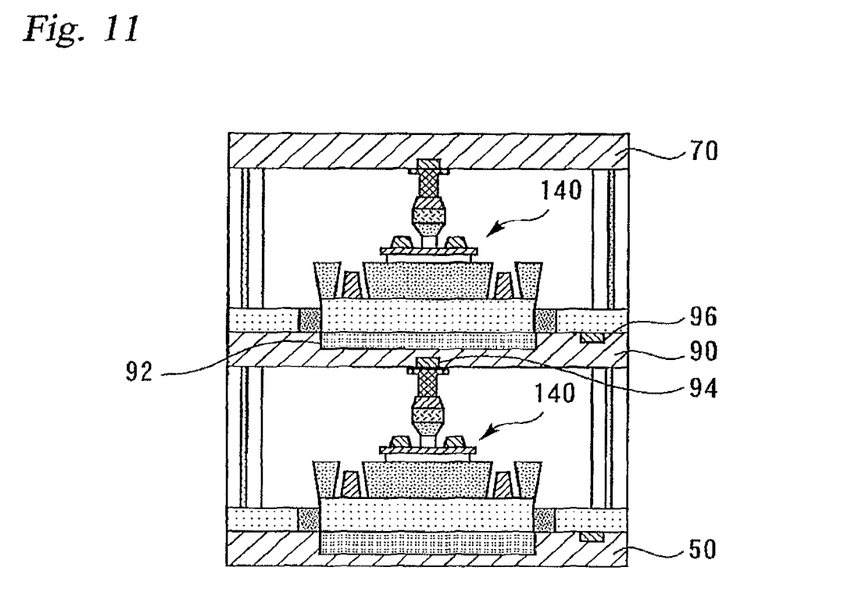
FIG. 11 is a diagram showing a structure of a semiconductor circuit substrate in accordance with a fifth embodiment of the present invention.

FIG. 11 is a diagram showing a device structure of a semiconductor circuit substrate in accordance with a fifth embodiment of the present invention. The device structure of FIG. 11 includes two device structures similar to that of the third embodiment shown in FIG. 5 which are stacked one on top of the other (i.e., stacked in a direction perpendicular to the substrate surface).

Referring to FIG. 11, a circuit-forming substrate 90 is disposed between two transistor-forming substrates 10 (i.e., disposed between two transistors 140 aligned vertically as viewed in FIG. 11). The circuit-forming substrate 90 includes contact regions 92, 94, and 96. The circuit-forming substrate 90 is similar in basic construction to the circuit-forming substrates 50 and 70; however, they have different internal circuit configurations. The circuit-forming substrate 90 contains wiring conductors and/or passive circuits for electrically connecting the two transistors 140 together. Specifically, these wiring conductors or passive circuits are electrically connected through the contact region 94 to the lower transistor 140, and through the contact regions 92 and 96 to the upper transistor 140, as viewed in FIG. 11.

FIG. 11 shows only two transistors 140 and adjacent components. However, as in the semiconductor circuit substrates of the first to fourth embodiments, the transistor-forming substrates 10 and the circuit-forming substrates 50, 70, and 90 of the semiconductor circuit substrate of the fifth embodiment are bonded together on a wafer level so as to form a number of device structures identical to that shown in FIG. 11 which are arranged across the surfaces of the transistor-forming substrates 10. That is, in the present embodiment, the circuit-forming substrate 50, the lower transistor-forming substrate 10, the circuit-forming substrate 90, the upper transistor-forming substrate 10, and the circuit-forming substrate 70 are bonded to one another on a wafer level, forming a multilayer structure. The resulting semiconductor circuit substrate of the present embodiment includes a number of semiconductor structures identical to that shown in FIG. 11 which are arranged across the surfaces of the transistor-forming substrates 10. The bonding of the substrates together is accomplished by a wafer bonding technique. The semiconductor circuit substrate is eventually cut into individual chips each corresponding to the device structure shown in FIG. 11. Each discrete device structure, or chip, corresponds to the "semiconductor device" of the fifth embodiment.

Since in the present embodiment two transistors 140 are disposed one above the other vertically (i.e., in the direction in which the substrates are stacked), the required chip surface area (or wafer surface area) for this device is smaller than when these transistors are disposed side by side on the substrate. It should be noted that any number of transistors 140 may be bonded on top of one another. That is, three, four or more transistors 140 may be disposed vertically one above another by bonding the corresponding number of transistor-forming substrates (10) and circuit-forming substrates (50, 90, 70) together in an alternating arrangement. As in the first to third embodiments, the transistors 140 of the fifth embodiment may be replaced by HBTs or other suitable semiconductor active elements (e.g., diodes).

Sixth Embodiment

Figure 12:
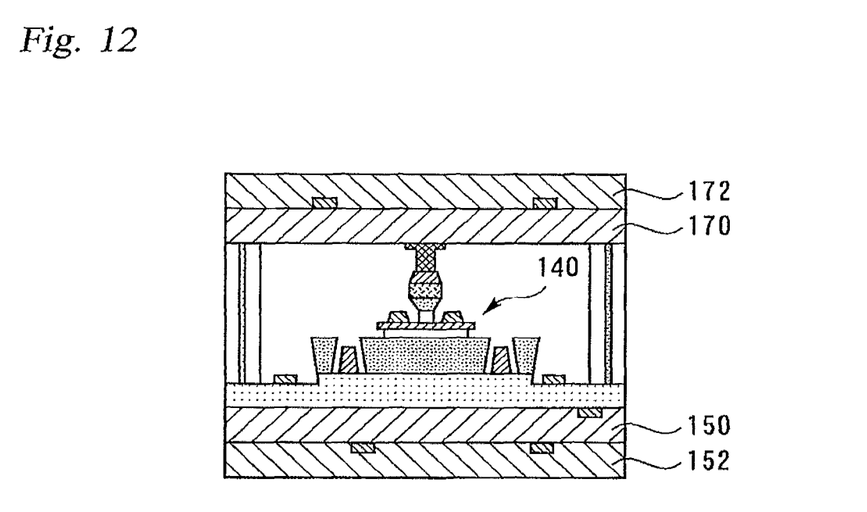
FIG. 12 is a diagram showing a structure of a semiconductor circuit substrate in accordance with a sixth embodiment of the present invention.

FIG. 12 is a diagram showing a device structure of a semiconductor circuit substrate in accordance with a sixth embodiment of the present invention. This device structure (or semiconductor device) is similar to that of FIG. 5, except that the circuit-forming substrates 50 and 70 are replaced by circuit-forming substrates 150 and 170, respectively, and that a circuit-forming substrate 152 is bonded to the bottom surface of the circuit-forming substrate 150 and a circuit-forming substrate 172 is bonded to the top surface of the circuit-forming substrate 170. These circuit-forming substrates 150, 152, 170, and 172 are formed of material other than compound semiconductor and are electrically connected to one another through their contact regions. Each of the circuit-forming substrates 150, 152, 170, and 172 has a wiring conductor(s) and/or a passive circuit(s). These circuit-forming substrates may be identical or different in internal construction.

Since each circuit-forming substrate can accommodate a certain number of circuits, the more circuit-forming substrates in a semiconductor circuit substrate, the fewer circuits need to be formed in the transistor-forming substrate, and hence the smaller the required circuit area on the transistor-forming substrate and the smaller the area of each chip. Therefore, the number of circuit-forming substrates may be increased to increase the number of transistors that can be formed on the transistor-forming substrate 10, thus saving compound semiconductor material.

Seventh Embodiment

Figure 13:
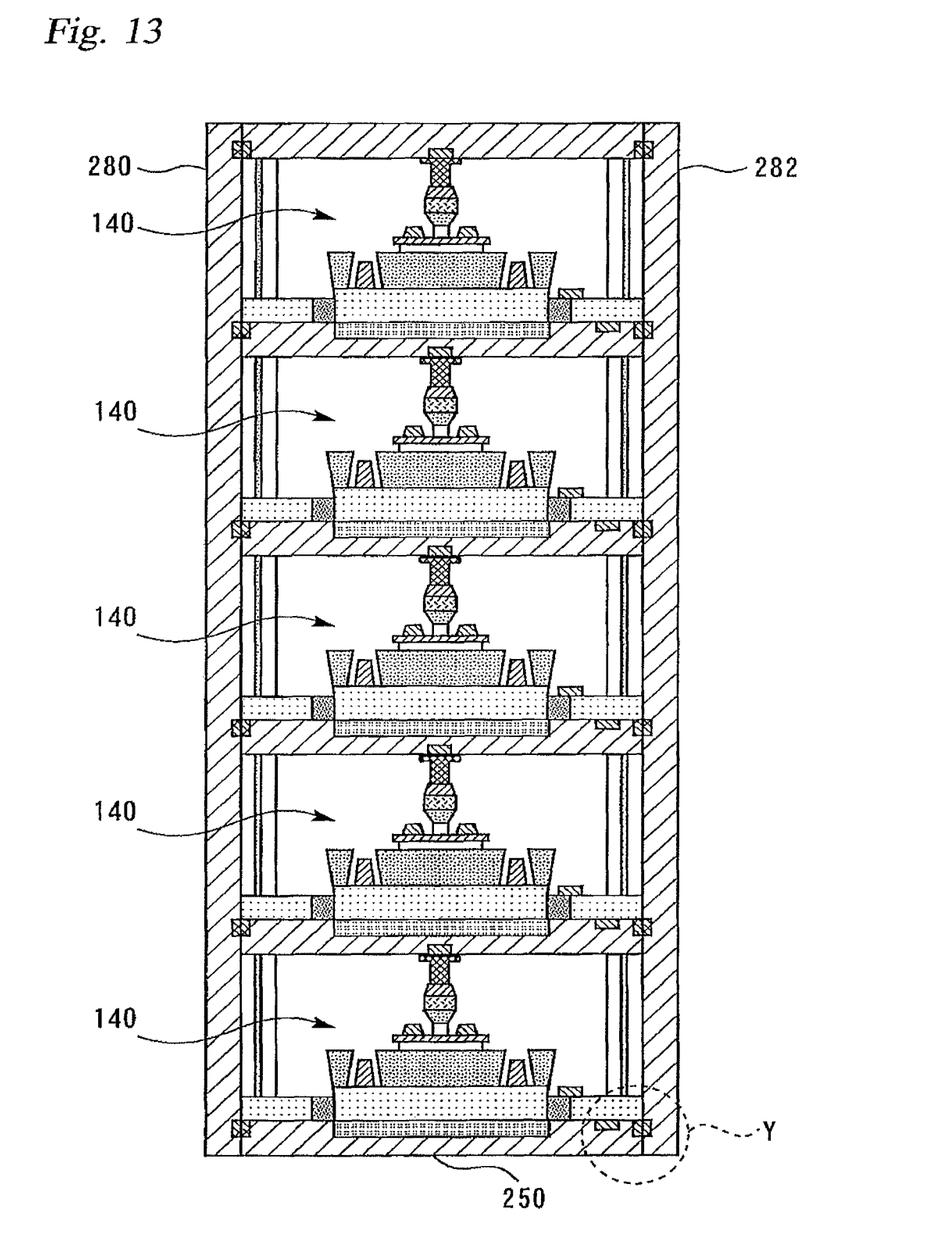
FIG. 13 is a diagram showing a structure of a semiconductor device in accordance with a seventh embodiment of the present invention.

FIG. 13 is a diagram showing the construction of a semiconductor device in accordance with a seventh embodiment of the present invention. The semiconductor device of the seventh embodiment differs from that of the fifth embodiment shown in FIG. 11 in that that it includes more than two stacked device structures (in this case, five stacked device structures) which are each similar to the device structure shown in FIG. 5. Further, circuit-forming substrates 280 and 282 are bonded to opposite sides respectively of the semiconductor device. These circuit-forming substrates 280 and 282 extend in the direction of the stack and serve to prevent the stacked device structures from becoming misaligned.

In practical applications, the semiconductor device (or chip) of the seventh embodiment may be mounted with the circuit-forming substrate 280 or 282 at the bottom, since these circuit-forming substrates 280 and 282 have a greater length than the transistor-forming substrates 10, which are perpendicular to the substrates 280 and 282. Further, the open sides of the semiconductor device may be covered by circuit substrates; that is, all sides of the semiconductor device are enclosed by circuit substrates. Thus, when in use, the semiconductor device of the seventh embodiment may be mounted in an orientation rotated 90 degrees relative to the view of FIG. 13 (i.e., with the circuit-forming substrate 280 or 282 at the bottom).

A circuit-forming substrate 250 is bonded to each of the five transistor-forming substrates 10. Like the circuit-forming substrate 90 described in connection with the fifth embodiment, each circuit-forming substrate 250 has contact regions in its top and bottom surfaces. (It should be noted that the lowermost circuit-forming substrate 250 may not have a contact region in its bottom surface.) Further, each circuit-forming substrate 250 has contact regions in opposite sides thereof and can be electrically connected to the circuit-forming substrates 280 and 282 through these contact regions (see the region Y indicated by the dashed circle in FIG. 13).

Figure 14A:
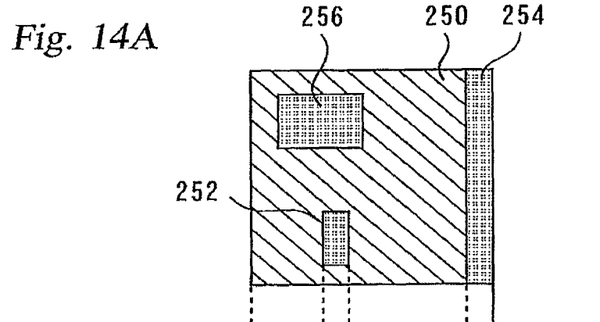
FIG. 14 includes enlarged views of the region Y indicated by the dashed circle in FIG. 13.
Figure 14B:
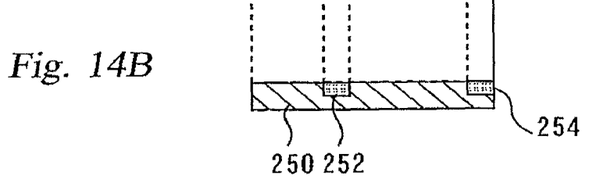

FIG. 14 includes enlarged views of the region Y indicated by the dashed circle in FIG. 13. FIG. 14A is a plan view (as viewed from the top of FIG. 13) of the surface of a portion of the lowermost circuit-forming substrate 250, which portion is bonded to the bottom surface of the lowermost transistor-forming substrate 10. FIG. 14B is an enlarged view of the region Y. Referring to FIG. 14, the circuit-forming substrate 250 has in opposite ends thereof contact regions 254 (or buried circuits or buried contact regions) for electrical connection with the circuit-forming substrates 280 and 282. It should be noted that in FIG. 14 the reference numerals 252 and 256 denote contact regions of the circuit-forming substrate 250 which are adapted for electrical connection with the transistor-forming substrate 10.

Transistors may be stacked on top of one another on a substrate to reduce chip cost. However, if too many transistors are stacked, then the resulting multilayer structure has a long dimension in a direction perpendicular to the substrate surface, which might prevent stable mounting of the structure. In order to avoid this, the semiconductor device (or multilayer structure) of the present embodiment is mounted so that the long or maximum dimension of the device extends laterally. Further, the inexpensive circuit-forming substrates 280 and 282, which are made of material other than compound semiconductor material, are bonded to two opposite long sides of the device, resulting in reduced cost of the device. It should be noted that the semiconductor device of the present embodiment may be rotated 90 degrees or any other suitable angle relative to the view of FIG. 13 as long as it is stable when supported on a long side thereof.

Eighth Embodiment

Figure 15A:
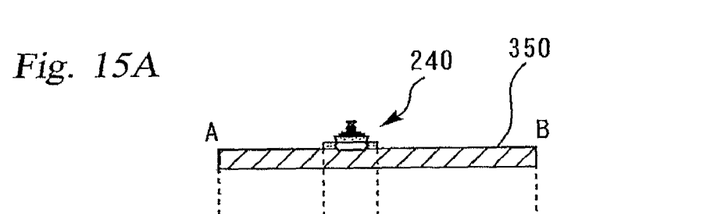
FIG. 15 includes schematic diagrams showing the construction of a semiconductor device in accordance with an eighth embodiment of the present invention.
Figure 15B:
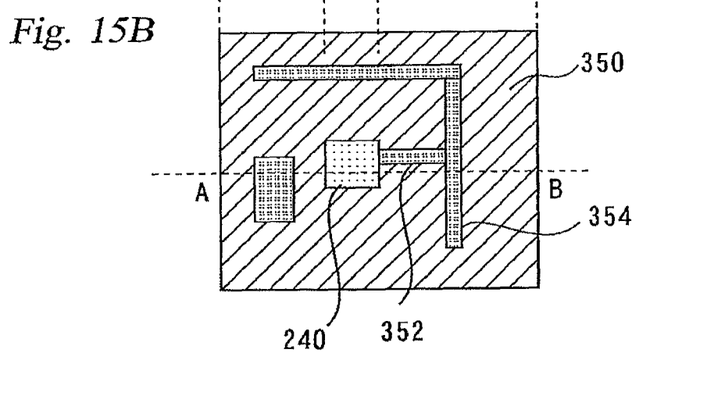

FIG. 15 includes schematic diagrams showing the construction of a semiconductor device in accordance with an eighth embodiment of the present invention. FIG. 15A is a cross-sectional view of the transistor-forming substrate 10 of the semiconductor device, and FIG. 15B is a top view of the semiconductor device.

The semiconductor device of the eighth embodiment essentially differs in construction from those of the first to sixth embodiments. Specifically, in the first to sixth embodiments, the transistor-forming substrate 10 and the circuit-forming substrate 50 are bonded together on a wafer level (see, e.g., FIG. 1). In the eighth embodiment, on the other hand, a single transistor chip 240 (corresponding to an individual chip cut from the transistor-forming substrate 10 of the first to sixth embodiments described above) is bonded onto a circuit-forming substrate 350. The circuit-forming substrate 350 is provided with wiring conductors 354 and 352. The wiring conductors 352 and 354 connect with the area on which the transistor chip 240 is mounted. Like the circuit-forming substrate 50, the circuit-forming substrate 350 is formed of material other than compound semiconductor and has passive circuits, etc. formed therein.

Figure 16:
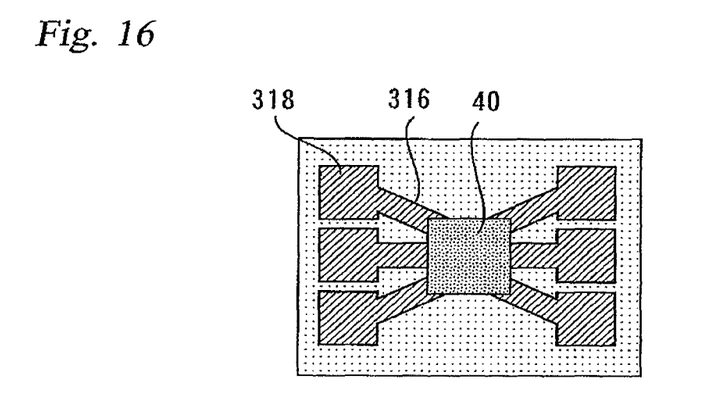
FIG. 16 is an enlarged plan view of the transistor chip of FIG. 15.

FIG. 16 is an enlarged plan view of the transistor chip 240 of FIG. 15. The transistor chip 240 has a BJT 40, wiring conductors 316, and pads 318 formed therein. A via hole (not shown) is formed under each pad 318 (i.e., behind each pad 318 as viewed in FIG. 16) and extends to the bottom surface of the transistor chip 240.

In accordance with the present embodiment, the circuit-forming substrate 350 can be made larger in area than the transistor-forming substrate 10. This allows passive circuits to be formed in the circuit-forming substrate 350 instead of the transistor-forming substrate 10 (which is made of compound semiconductor and therefore is expensive), making it possible to increase the number of transistors formed in the transistor-forming substrate 10, resulting in reduced chip cost.

It should be noted that in the eighth embodiment described above, the structure shown in FIG. 15, which includes the transistor chip 240 bonded to the circuit substrate 350, corresponds to the semiconductor device of the first aspect of the present invention described in the Summary of the Invention section. Further, the following should be noted: the compound semiconductor substrate portion of the transistor chip 240 corresponds to the first substrate of the first aspect of the invention; the transistor element on the transistor chip 240 corresponds to the semiconductor active element of the first aspect; and each of the contact regions in the bottom surface of the transistor chip 240 (i.e., the contact region, not shown, under the transistor element and the exposed portion of the via hole, not shown) corresponds to the first contact region of the first aspect. Further, the circuit-forming substrate 350 of the eighth embodiment described above corresponds to the second substrate of the first aspect of the invention; each of the passive circuits (not shown) formed in the circuit-forming substrate 350 and including the wiring conductors 354 and 352 corresponds to the passive circuit of the first aspect; and the contact region in the top surface of the circuit-forming substrate 350 which is in contact with the bottom surface of the transistor chip 240 (see FIG. 15B) corresponds to the second contact region of the first aspect.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2010-178431, filed on Aug. 9, 2010 including specification, claims, drawings and summary, on which the Convention priority of the present application is based, are incorporated herein by reference in its entirety.

What is claimed is:

1. A semiconductor device comprising:
   a first substrate having a top surface and a flat bottom surface, and having in the top surface, a compound semiconductor layer in which a semiconductor active element is located, and having, in the bottom surface, a first contact region for electrical connection, the first contact region being electrically connected to the semiconductor active element; and
   a second substrate of a material other than a compound semiconductor, having a flat top surface, and a second contact region buried in and exposed at the top surface, and a having a passive circuit electrically connected to the second contact region, the second substrate having no semiconductor active elements, the passive circuit being either buried within the second substrate or exposed at a bottom side of the second substrate so that there are no irregularities on the top surface of the second substrate, the flat top surface of the second substrate being directly bonded to the flat bottom surface of the first substrate so that the first contact region is electrically connected to the second contact region.

2. The semiconductor device according to claim 1, further comprising a third substrate of a material other than a compound semiconductor disposed on the same side of the first substrate as the top surface the first substrate and electrically connected to the semiconductor active element of the first substrate, the third substrate having no semiconductor active elements.

3. The semiconductor device according to claim 2, further comprising a sidewall disposed on the first substrate and surrounding the semiconductor active element so that the sidewall and the first and third substrates define an enclosed space containing the semiconductor active element.

4. The semiconductor device according to claim 3, wherein the sidewall includes a connection portion of a conductive material extending between the first and third substrates.

5. A semiconductor device comprising:
at least two of the semiconductor devices of claim 2, wherein a surface of the third substrate of a firsts of the semiconductor devices is bonded to the top surface of the second substrate of a second of the semiconductor devices, the surface of the third substrate not being electrically connected to a circuit of the first substrate.

6. A semiconductor circuit substrate comprising:
a first substrate having a top surface and a flat bottom surface, and having a compound semiconductor layer in which a plurality of semiconductor active elements are located, and having, in the bottom surface, a plurality of first contact regions for electrical connection, each first contact region being electrically connected to a respective one of the plurality of semiconductor active elements; and
a second substrate of a material other than a compound semiconductor, having a flat top surface, and having a plurality of second contact regions buried in and exposed at the top surface, and having a plurality of passive circuits, each passive circuit being electrically connected to a respective one of the plurality of second contact regions, the second substrate having no semiconductor active elements, the plurality of passive circuits being either buried within the second substrate or exposed at a bottom side of the second substrate so that there are no irregularities on the top surface of the second substrate, the flat top surface of the second substrate being directly bonded to the flat bottom surface of the first substrate so that each of the plurality of first contact regions is electrically connected to a respective one of the plurality of second contact regions.

7. The semiconductor circuit substrate according to claim 6, further comprising a third substrate of a material other than a compound semiconductor, disposed on the same side of the first substrate as the top surface of the first substrate and connected with the semiconductor active elements of the first substrate, the third substrate having no semiconductor active elements.

8. The semiconductor circuit substrate according to claim 7, further comprising a sidewall disposed on the first substrate and surrounding the semiconductor active elements so that the sidewall and the first and third substrates define an enclosed space containing the semiconductor active elements.

9. The semiconductor circuit substrate according to claim 8, wherein the sidewall includes a connection portion of a conductive material extending between the first and third substrates.

10. A semiconductor circuit substrate comprising:
at least two semiconductor circuit substrates of claim 7, wherein a surface of the third substrate of a first of the semiconductor circuit substrates is bonded to the top surface of the second substrate of a second of the semiconductor circuit substrates, the surface of the third substrate not being electrically connected to a circuit of the first substrate.

11. The semiconductor circuit substrate according to claim 6, wherein the bottom surface of the first substrate and the top surface of the second substrate have a roughness of not more than 3 nm.

12. The semiconductor circuit substrate according to claim 6, wherein the first substrate has a thickness of not more than 100 μm.

13. A method of manufacturing a semiconductor circuit substrate, comprising:
providing a first substrate including a compound semiconductor layer and having a top surface and a bottom surface;
providing a second substrate of a material other than a compound semiconductor and having a top surface and a bottom surface;
forming a semiconductor active element in the compound semiconductor layer of the first substrate, smoothing and activating the bottom surface of the first substrate by plasma treatment or by ions from an ion gun, and forming a first contact region in the bottom surface of the first substrate for electrical connection and electrically connected to the semiconductor active element;
smoothing and activating the top surface of the second substrate by plasma treatment or by ions from an ion gun, forming a second contact region buried in and exposed at the top surface of the second substrate, and forming a passive circuit in the second substrate, the passive circuit being electrically connected to the second contact region and being either buried within the second substrate or exposed at a bottom side of the second substrate so that there are no irregularities on the top surface of the second substrate; and
directly bonding the smoothed bottom surface of the first substrate to the smoothed top surface of the second substrate by thermocompression bonding or cold bonding so that the first contact region is electrically connected to the second contact region.

14. The method according to claim 13, further comprising:
applying a first material over a surface of the first substrate, the surface having the semiconductor active element;
forming a groove in the first material so that the groove encloses the semiconductor active element;
filling the groove with a second material used to form a sidewall for packaging the semiconductor active element;
adjusting heights of the first and second materials so that an electrode of the semiconductor active element is exposed and so that the top surfaces of the first and second materials and the exposed surface of the electrode together form a continuous flat surface;
providing a third substrate made of a material other than a compound semiconductor and having no semiconductor active elements; and
either with or without removing the first material, mounting the third substrate on the sidewall of the second material so that the third substrate is located on the same side of the first substrate as the top surface the first substrate and electrically connected to a circuit of the first substrate.

15. The method according to claim 14, further comprising:
forming a via hole in the second material filling the groove;
filling the via hole with conductive material to form a via; and mounting the third substrate so that the third substrate is electrically connected to the circuit of the first substrate through the via.

16. A method of manufacturing a semiconductor device, comprising:
   manufacturing a semiconductor circuit substrate in accordance with the method of claim 13; and
   dividing the semiconductor circuit substrate into a plurality of chips each chip including a semiconductor device.

* * * * *